United States Patent [19]

Hollingsead et al.

[11] 4,018,091
[45] Apr. 19, 1977

[54] PIVOTABLE EXTRACTOR HOLD DOWN APPARATUS

[75] Inventors: Robert Allen Hollingsead, Yorba Linda; Clyde Robert Pryor, Anaheim, both of Calif.

[73] Assignee: Hollingsead-Pryor Enterprises, Inc., Santa Fe Springs, Calif.

[22] Filed: Aug. 28, 1975

[21] Appl. No.: 608,565

Related U.S. Application Data

[63] Continuation of Ser. No. 360,113, May 14, 1973, abandoned.

[52] U.S. Cl. .............................. 74/89.15; 339/91 R
[51] Int. Cl.² ......................................... F16H 27/02
[58] Field of Search ................ 74/89.15; 339/91 R; 248/361 R

[56] References Cited

UNITED STATES PATENTS

| | | | |
|---|---|---|---|
| 3,147,005 | 9/1964 | Miller | 248/361 R |
| 3,640,141 | 2/1972 | Hollingsead | 74/89.15 |
| 3,796,985 | 3/1974 | Weber | 339/91 R |

Primary Examiner—Samuel Scott
Assistant Examiner—Wesley S. Ratliff, Jr.
Attorney, Agent, or Firm—Jackson & Jones Law Corporation

[57] ABSTRACT

A mounting member for an extractor hold down apparatus permits the extractor to exert both extraction and insertion forces at different angles to, for example, an electronic unit on an avionic rack. The mounting member is provided with a pair of elongated slots that accommodate a cross bar and retaining disks mounted on the power shaft of the extractor. The slots provide an angle range of at least 18° plus or minus 15°.

6 Claims, 3 Drawing Figures

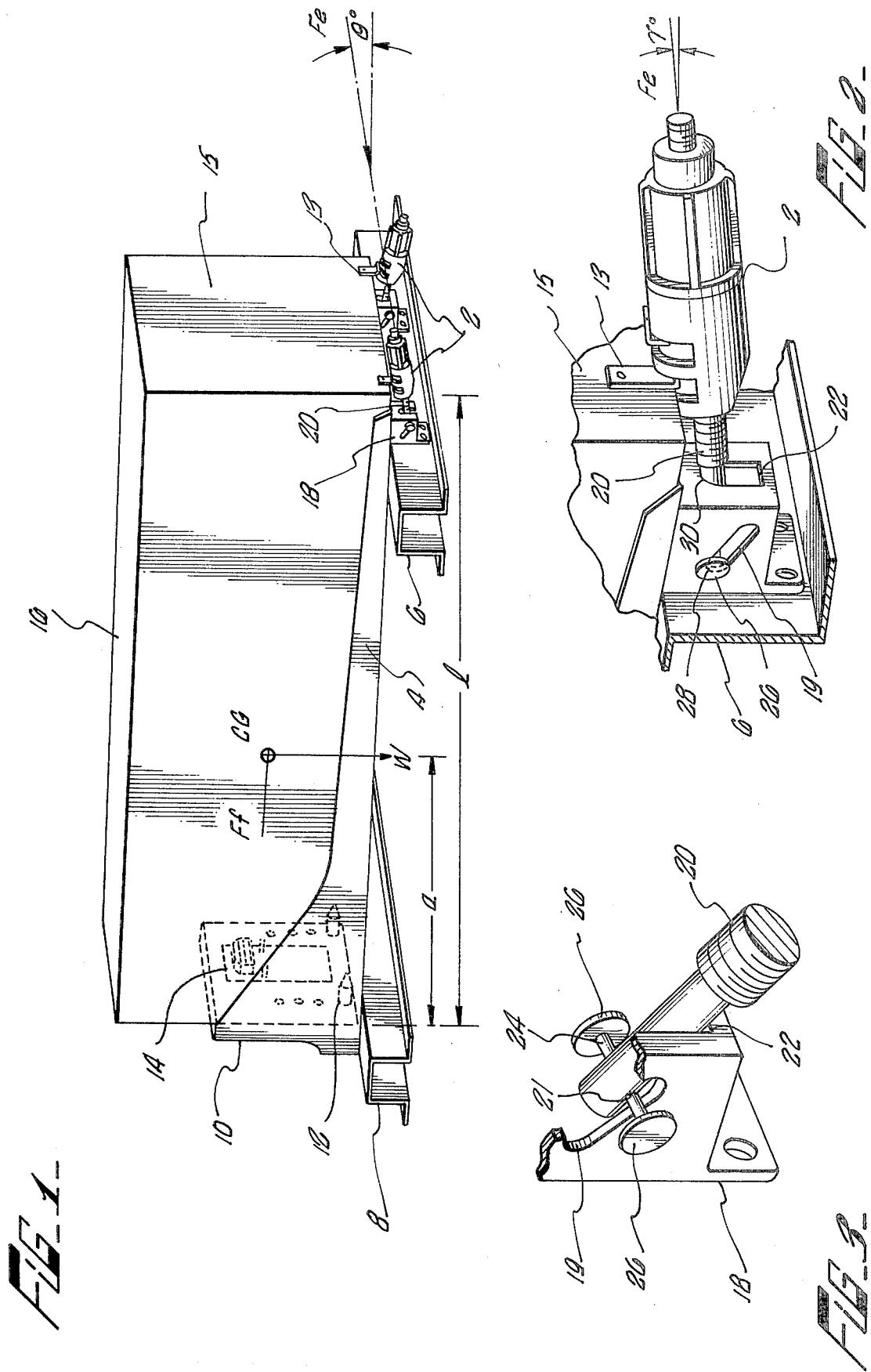

PIVOTABLE EXTRACTOR HOLD DOWN APPARATUS

This is a continuation, of application Ser. No. 360,113, filed May 14, 1973, now abandoned.

BACKGROUND OF THE INVENTION

1. Field of the Invention

The present invention relates to the mounting of electronic equipment and, more particularly, to means for extracting and securing units of electronic equipment onto a shelf or avionic rack.

2. Description of the Prior Art

The development of electronic equipment has been generally standardized into set sizes of electronic units to accommodate their use in various structures, for example, aircraft. To support these electronic units, appropriate support structures, such as avionic trays and rack have been developed to securely support and safeguard this expensive equipment against destruction. Since it is necessary to provide electrical connections to the units of electronic equipment, the mounting of the electrical units are the mounting structure must be precisely accomplished to insure proper alignment between the connectors on the electronic units and the electrical connectors in the mounting structure and to maintain the units in a secure position without introducing damaging forces on the connector.

Particular problems occur in vehicles such as aircraft that are subject to vibration and substantial stresses. Many of these problems have been solved with the use of an extractor as illustrated in U.S. Pat. No. 3,640,141 granted Feb. 8, 1972. With this slip clutch extractor hold down apparatus, it is possible to securely lock the electronic unit to the rack and to both insert and remove the unit from its electrical connections.

Problems have occurred in providing a conventional mounting for the extractor hold down apparatus due to the limited amount of space available for pivotably anchoring the hold down device.

It has been found that frequently an application of force would pivot the electronic unit about its lower rear edge on its electronical connector and this would exert a large amount of stress on the electrical connection pins that extend into the body of the electronic unit. This problem is particularly acute in aircraft where the space available is necessarily kept at a minimum and thus the location of the extractor hold down and its angular relationship to the shelf and electronic unit is limited.

SUMMARY OF THE INVENTION

The present invention provides a mounting apparatus in combination with an extractor hold down apparatus that permits the optimum placing of the extractor hold down apparatus relative to the electronic unit for connecting the extractor hold down apparatus to the electronic unit and for both the removal and final insertion of the electronic unit into its respective electrical connections. This is accomplished by providing the shaft of the extractor apparatus with a cross bar or a traverse shaft and retaining disks and further providing a slot placed at an angle to the plane of a support tray for the electronic unit whereby the extractor hold down apparatus can vary its angular relationship relative to the support tray of an electronic rack and thereby assume the preferred position during either insertion or extraction of the electronic unit to provide both a force parallel and perpendicular to the plane of the support tray during insertion and a force mainly parallel to the support tray during extraction.

In addition, the slot also facilitates the connecting of the extractor hold down apparatus with the complimentary edge of the electronic units. During extraction, the extractor shaft is prevented from pivoting in a direction perpendicular to the support tray, thereby preventing any inadvertant pivot force from being applied at the electrical connector.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings.

BRIEF DESCRIPTION OF THE DRAWINGS

FIG. 1 is a perspective schematic view of the present invention with the extractor hold down apparatus in the desired position for applying an insertion force to the electronic unit;

FIG. 2 is a schematic view of the extractor hold down mounting apparatus with the extractor hold down apparatus in the optimum position for removing the electronic unit; and FIG. 3 is a perspective partial view of the present invention.

DESCRIPTION OF THE PREFERRED EMBODIMENT:

Referring to FIG. 1, an overload clutch hold down or extractor hold down member 2 is provided as described in U.S. Pat. No. 3,640,141 (1972) granted to Hollingsead, Kuchler and Pryor. The disclosure of this patent is hereby incorporated by reference.

The extractor hold down apparatus 2 is designed to be removably locked onto the hooks 13 of the front plate 15 of the electronic unit 16 for exerting a force on the unit 16. The extractor hold down apparatus 2 is capable of firmly locking the electronic unit 16 to the shelf or avionic tray 4. In addition, it is also capable of initiating a removal of the electronic unit 16 from the avionic tray 4 along an axis of movement parallel to the plane of the support surface of the avionic tray 4

The avionic tray 4 carries a back plate 10 capable of providing the appropriate electrical connectors 14. The electrical connectors 14, as understood in the prior art, can be of various shapes and sizes. Spring biased dagger pins 12 are generally located at each lower corner of the back plate 10 for insertion into appropriate bores located in the housing of the electronic unit 16.

The avionic tray 4 is generally supported on front and rear support rails 6 and 8 respectively. Generally, the avionic tray will carry a sealing gasket (not shown) on its bottom for engagement with the bottom surface of the electronic unit 16. This arrangement permits the introduction of cooling air to the electronic unit 16. In addition, the electronic unit 16 will have handles (not shown) located on the front plate 15. These handles allow the application of a manual force to the electronic unit 16 both during the initial insertion and the final extraction phase after the extractor hold down apparatus 2 has been removed from the front plate 15. All the force applied to the electronic unit 16 is through the front plate 15.

As can be seen from FIG. 1, for illustrative purposes it is assumed that the center (Fe). gravity of the particular electronic unit 16 disclosed will be a distance (a) from the back plate 10 and that the length of the unit will be a distance (l). The total forces exerted on the electronic unit 16 during the use of the extractor hold down apparatus 2 will be basically the frictional forces (Ff) between the avionic tray 4 and the electronic unit 16 and the extractor force (fe). A number of different factors will contribute to the total static coefficient of friction of the avionic tray 4 such as the sealing gasket (not shown), the electrical connectors 14, the dagger pins 12 and the metal contact of the avionic tray 4 with the electronic unit 16. As can be easily understood, since the electronic units themselves vary in weight, the exact frictional force will accordingly vary and different amounts of forces will have to be exerted by the extractor hold down apparatus 2 to accommodate the particular electronic unit 16. The static frictional force (Ff) will have to be overcome by the horizontal force factor of the extractor force (Fe).

During the insertion of the electronic unit 16 into its operative position adjacent the back plate 10, the extractor force (Fe) will exert in addition to the horizontal force a relatively downward vertical force that will be neutralized effectively by the front rail support 6. Before the magnitude of the downward vertical force would be capable of rotating the electronic unit 16 about the front rail 6, the static frictional force (Ff) will be overcome by the horizontal force and the electronic unit 16 will be moved into an operative position.

It is advantageous to have the extractor apparatus 2 positioned at a relatively large angle $\theta$ degrees to the electronic unit 16 since this permits the shaft 20 to be relatively short and thereby minimize space. It also facilitates the connection of the extractor apparatus 2 with the front plate 15. An angle of $\theta$ degress in the range of 25° to 35° is acceptable. Larger angles are permissible but are not as efficient in applying force.

During the removal phase as disclosed in FIG. 2, it is necessary to minimize the upward vertical force generated by the extractor force (Fe). This is accomplished by minimizing the relative angle $\gamma$ degrees to the electronic unit 16 thereby maximizing the horizontal force to overcome the static friction force (Ff) and minimizing the vertical force. A range of angles between 0° and 20° have been found acceptable.

The vertical force is located at a distance (l) from the end of the electronic unit 16 and is capable of surpassing the counter moment force generated by the weight of the electronic unit 16 (W) times the distance (a) from the center of gravity. When this vertical force is in a direction away from the plane of the support tray 4, as is the case when the electronic unit is being manually removed from its support tray, the electronic unit 16 will pivot about the back plate 10 out of its normal plane and will even lift upward from the front edge of the avionic tray 4 adjacent the front support rail 6. This movement is capable of warping, bending or even breaking the electronic connections 14. This is a particularly serious problem since an extremely expensive electronic unit 16 can be completely disabled by damaging its electrical connectors. By maintaining a small angle $\gamma$ degrees, any vertical force factor away from the avionic tray support surface; will be minimized. Also, the top edge 30 of the entrance slot 22 for the extractor shaft 20 prevents the shaft from moving upward beyond that edge. This edge 30 absorbs all upward forces applied to the front of the electronic unit during extraction, effectively locking the extractor shaft 20 into a substantially horizontal position during extraction.

While it should be appreciated that the actual angles $\theta$ degrees and $\gamma$ degrees can be variable over a limited range since each electronic unit 16 may have a different weight, it has been found that a range of angles between a $\gamma$ degree angle of 3° to a $\theta$ degree angle of 35° has been successful in operation. Generally, the range can vary from a median of 18° by a plus or minus 15°.

The variation of the angular position of the extractor apparatus 2 has been accomplished by the particular mounting member 18 being provided with a lost motion slot 19 where one end of the slot will provide the $\gamma$ degree angle and the other end of the slot will provide the $\theta$ degree angle. While the slot 19 is disclosed preferably as an oval configuration, it should be realized that other shapes that would permit the relative anchoring of the hold down shaft 20 can be utilized, such as rectangular, etc. The front portion of the mounting member 18 has an entrance slot 22 to receive the shaft 20.

Referring to FIG. 3, the hold down shaft 20 is provided with a bore 21 for receiving a transversely positioned shaft or cross bar 24. A carriage member 32 is moveably mounted on the shaft 20 and is capable of being operatively connected to the unit 16 for applying an insertion or extraction translational force to the unit 16. At both ends of the shaft 24 are retainer disks 26. The retainer disks 26 are larger in diameter than the opening of the slot 19. In the alternative, a single stud projecting through a single slot 19 could be utilized with the hold down shaft 20 journaled in a fixed path of motion.

The hold down shaft 20 and correspondingly the extractor hold down apparatus 2 is capable of a lost motion movement relative to the electronic unit 16 along the slot 19. The mounting member 18 can be attached to the front rail 6 by any appropriate means such as nuts and bolts (not shown).

In operation, the extractor 2 will be positioned at the forward portion of the mounting member slot 19, as shown in FIG. 1 at an angle $\theta$ degrees for inserting the electronic unit 16. During extraction of the electronic unit 16, it is necessary to minimize the vertical force produced by the extractor force (Fe) and this is accomplished by permitting the extractor apparatus 2 to be located at the other end of the slot 19 as shown in FIG. 2 at the smaller angle $\gamma$ degrees. The relative locations of the top edge 28 of the slot 19 and the top edge 30 of the entrance slot 22 provide a safety feature in the present invention. By permitting the top edge 30 of the entrance slot 22 to extend only a short distance above the plane of the top edge 28, the shaft 20 will be locked against further upward movement during the extraction phase. This effectively prevents the electronic unit 16 from being raised relative to the front support rail 8 and accordingly safeguards the connectors 14 from damage. As a result of the mounting member 18 of the present invention, the extractor hold down apparatus 2 is more flexible in permitting a connection with the front plate 15 of the electronic unit 16. In addition, the stringent space requirements, for example, in an aircraft are maintained by the particulr mounting member 18. Finally, the possibility of damage to the electrical connection 14 is removed.

Since the above description refers to the preferred embodiment, it should be understood that those skilled in the art could accomplish modifications within the scope of the present invention and accordingly, the present invention should be measured from the following claims.

What is claimed is:

1. Apparatus for inserting an electronic unit in and removing it from a supporting structure having a supporting surface by applying forces at one end of said electronic unit, relative to said supporting structure, whereby the electronic unit is inserted and removed along an axis of movement parallel with the supporting surface, said apparatus comprising:
means for applying insertion forces to said one end of said electronic unit, said insertion forces having a force component perpendicular and directed towards said supporting surface and a force component parallel to said supporting surface;
means for applying extraction forces to said one end of said electronic unit, and for controlling the angle of application of said extraction forces such that a force component parallel to said supporting surface and substantially no components in a direction perpendicular to said supporting surface are exerted for the duration of travel of said electronic unit along said axis; and
means for locking said extraction force applying means into a position that prevents said electronic unit from being lifted out of contact with said supporting surface despite any extraneous force being applied to said electronic unit during extraction.

2. An improved hold down and extraction apparatus for inserting an electronic unit in and removing it from a supporting structure having a supporting surface, said electronic unit having the first half of a cable connector mounted at one end thereof and the second half of said cable connector being mounted on said supporting structure, mounting being accomplished by applying forces at the second end of said electronic unit relative to said supporting structure, said apparatus comprising:
means connected to said second end for applying extraction and insertion forces to said electronic unit, said insertion forces having a force component perpendicular and directed towards said supporting surface and a force component parallel to said supporting surface;
means for controlling the angle of applicaton of said extraction forces such that a force component parallel to said supporting surface and substantially no force component in a direction perpendicular to said supporting surface are exerted for the duration of the extraction of said first and second halves of said cable connectors; and
means for locking said extraction force applying means into a position that prevents said electronic unit from being lifted out of contact with said supporting surface by any extraneous force applied to said electronic unit during engagement of the first and second halves of said cable connectors.

3. Apparatus for supplying insertion and extraction forces to an electronic unit with respect to a supporting structure having a supporting surface, said apparatus comprising:
a shaft;
a carriage means movably mounted on said shaft for engaging one end of said electronic unit; and
mounting means attached to said supporting structure for pivotally receiving said shaft through an entrance slot, said slot being positioned to prevent pivotal movement of said shaft during extraction, whereby said electronic unit is prevented from being lifted out of contact with said supporting surface by an extraneous force applied during extraction.

4. The apparatus of claim 3 wherein said shaft is connected to said mounting means by a retaining means that includes a cross bar and a pair of retaining disks.

5. The apparatus of claim 4 wherein said mounting means includes an elongated slot with a first and second bearing surface adjacent to the respective ends of the slots, said first bearing surface being in contact with said cross bar of the retaining means during insertion, said second bearing surface being in contact with said cross bar of the retaining means during extraction, said second bearing surface being closer to said supporting surface than said first bearing surface.

6. An improved hold down and extraction apparatus for inserting an electronic unit in and removing it from a supporting structure having a supporting surface, said electronic unit having the first half of a cable connector mounted at one end thereof and the second half of said cable connector being mounted on said supporting structure, mounting being accomplished by applying forces at the second end of said electronic unit relative to said supporting structure, said apparatus comprising:
means connected to said second end for applying extraction and insertion forces to said electronic unit, said insertion forces having a force component perpendicular and directed towards said supporting surface and a force component parallel to said supporting surface; and
means for controlling the angle of application of said extraction forces such that a force component parallel to said supporting surface and a minimal force component in a direction perpendicular to said supporting surface are exerted for the duration of the extraction of said first and second halves of said cable connectors.

* * * * *

UNITED STATES PATENT AND TRADEMARK OFFICE
CERTIFICATE OF CORRECTION

PATENT NO. : 4,018,091

DATED : April 19, 1977

INVENTOR(S) : Robert A. Hollingsead & Clyde R. Pryor

It is certified that error appears in the above-identified patent and that said Letters Patent are hereby corrected as shown below:

Column 2, line 45, after "4" insert --.--.

Column 2, line 68, after "center" delete "(Fe)." and insert --of--.

Column 3, line 7, after "force" delete "(fe)." and insert --(Fe).--.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks